US011017143B2

(12) United States Patent
Barnaby et al.

(10) Patent No.: US 11,017,143 B2
(45) Date of Patent: May 25, 2021

(54) METHOD FOR MODELING EXCESS CURRENT IN IRRADIATED BIPOLAR JUNCTION TRANSISTORS

(71) Applicants: Arizona Board of Regents on behalf of Arizona State University, Scottsdale, AZ (US); California Institute of Technology, Pasadena, CA (US)

(72) Inventors: Hugh James Barnaby, Tempe, AZ (US); Philippe Adell, Pasadena, CA (US); Blayne Tolleson, Tempe, AZ (US)

(73) Assignees: Arizona Board of Regents on Behalf of Arizona State University, Scottsdale, AZ (US); California Institute of Technology, Pasadena, CA (US)

( * ) Notice: Subject to any disclaimer, the term of this patent is extended or adjusted under 35 U.S.C. 154(b) by 406 days.

(21) Appl. No.: 15/989,353

(22) Filed: May 25, 2018

(65) Prior Publication Data

US 2018/0341733 A1    Nov. 29, 2018

Related U.S. Application Data

(60) Provisional application No. 62/511,819, filed on May 26, 2017.

(51) Int. Cl.
*G06F 30/367* (2020.01)
*H01L 23/552* (2006.01)
(Continued)

(52) U.S. Cl.
CPC ............ *G06F 30/367* (2020.01); *H01L 22/20* (2013.01); *H01L 23/552* (2013.01);
(Continued)

(58) Field of Classification Search
CPC ..... G06F 30/367; H01L 22/20; H01L 23/552; H01L 29/1004; H01L 29/1008; H01L 29/402; H01L 29/66234; H01L 29/735
(Continued)

(56) References Cited

U.S. PATENT DOCUMENTS

| 8,704,191 B2 | 4/2014 | Yu et al. |
| 9,032,348 B2 | 5/2015 | Barnaby et al. |
| 2010/0219494 A1 | 9/2010 | Barnaby |

FOREIGN PATENT DOCUMENTS

WO    2011142845 A2    11/2011

OTHER PUBLICATIONS

Fleetwood et al. "Evaluation of Enhanced Low Does Rate Sensitivity in Fourth-Generation SiGe HBTs", Dec. 2014, IEEE Trans. on Nuclear Science, vol. 61, No. 6, pp. 2915-2922. (Year: 2014).*
(Continued)

*Primary Examiner* — Suzanne Lo
(74) *Attorney, Agent, or Firm* — Withrow & Terranova, P.L.L.C.

(57) ABSTRACT

The disclosure describes a method for modeling excess base current in irradiated bipolar junction transistors (BJTs). The method includes quantifying defect-related electrostatic effects of a BJT device to help improve accuracy in predicting an irradiated excess base current of the BJT device. The method can be adapted to model the excess base current of a lateral P-type-N-type-P-type (LPNP) BJT device in depleted and/or accumulated surface potential states. The predicted excess base current may be used to qualify or disqualify the BJT device or an electrical circuit including the BJT device for use in a space system(s) as a commercial-off-the-shelf (COTS) component. By modeling the excess base current based on quantifying and utilizing the defect-related electrostatic effects, it may be possible to accurately predict a total-ionizing-dose (TID) response of the BJT device, thus enabling faster and lower-cost qualification of a COTS component(s) for use in the space system(s).

20 Claims, 7 Drawing Sheets

(51) Int. Cl.
| | |
|---|---|
| H01L 29/10 | (2006.01) |
| H01L 29/66 | (2006.01) |
| H01L 21/66 | (2006.01) |
| H01L 29/40 | (2006.01) |
| H01L 29/735 | (2006.01) |

(52) U.S. Cl.
CPC ...... H01L 29/1004 (2013.01); H01L 29/1008 (2013.01); H01L 29/402 (2013.01); H01L 29/66234 (2013.01); H01L 29/735 (2013.01)

(58) Field of Classification Search
USPC .......................................................... 703/14
See application file for complete search history.

(56) References Cited

OTHER PUBLICATIONS

Sanchez Esqueda et al. "Compact Modeling of Total Ionizing Dose and Aging Effects in MOS Technologies", Aug. 2015, IEEE Trans. on Nuclear Science, vol. 62, No. 4, pp. 1501-1515. (Year: 2015).*
Barnaby et al. "Improved Model for Increased Surface Recombination Current in Irradiated Bipolar Junction Transistors", Aug. 2015, IEEE Trans on Nuclear Science, vol. 62, No. 4, pp. 1658-1664. (Year: 2015).*
Campbell et al., "Total Does and Dose Rate Models for Bipolar Transistors in Circuit Simulation", May 2013, Sandia Report SAND2013-3769, 81 pages. (Year: 2013).*
Zebrev, G.I., "Modeling and Simulation of the Enhanced Low-Dose-Rate Sensitivity of Thick Isolating Layers in Advanced ICs", 2006, Russian Microelectronics, vol. 35, No. 3, pp. 177-184. (Year: 2006).*
Schmidt et al. "Modeling Ionizing Radiation Induced Gain Degradation of the Lateral PNP Bipolar Junction Transistor", Dec. 1996, IEEE Trans. on Nuclear Science, vol. 43, No. 6, pp. 3032-3039. (Year: 1996).*
Ball, D. et al., "Separation of Ionization and Displacement Damage Using Gate-Controlled Lateral PNP Bipolar Transistors," IEEE Transactions on Nuclear Science, vol. 49, No. 6, Dec. 2002, IEEE, pp. 3185-3190.
Barnaby, H.J. et al., "Analytical Model for Proton Radiation Effects in Bipolar Devices," IEEE Transactions on Nuclear Science, vol. 49, No. 6, Dec. 2002, IEEE, pp. 2643-2649.
Barnaby, H.J et al., "Improved Model for Increased Surface Recombination Current in Irradiated Bipolar Junction Transistor," IEEE Transactions on Nuclear Science, vol. 62, No. 4, Aug. 2015, IEEE, 7 pages.
Chen, X.J. et al., "Mechanisms of Enhanced Radiation-Induced Degradation Due to Excess Molecular Hydrogen in Bipolar Oxides," IEEE Transactions on Nuclear Science, vol. 54, No. 6, Dec. 2007, IEEE, pp. 1913-1919.
Esqueda, I. et al., "Modeling the Effects of Hydrogen on the Mechanisms of Dose Rate Sensitivity," IEEE Transactions on Nuclear Science, vol. 59, No. 4, Aug. 2012, IEEE, pp. 701-706.
Kosier, S.L. et al., "Charge Separation for Bipolar Transistors," IEEE Transactions on Nuclear Science, vol. 40, No. 6, Dec. 1993, IEEE, pp. 1276-1285.
Muller, R.S. et al., "Device Electronics for Integrated Circuits," Third Edition, Wiley, 2003, Accessed online at https://b-ok.cc/dl/941842/98b0a9, 271 pages.
Pease, R. et al., "Characterization of Enhanced Low Dose Rate Sensitivity (ELDRS) Effects Using Gated Lateral PNP Transistor Structures," IEEE Transactions on Nuclear Science, vol. 51, No. 6, Dec. 2004, IEEE, pp. 3773-3780.
Schmidt, D.M. et al., "Modeling Ionizing Radiation Induced Gain Degradation of the Lateral PNP Bipolar Junction Transistor," IEEE Transactions on Nuclear Science, vol. 43, No. 6, Dec. 1996, IEEE, pp. 3032-3039.

* cited by examiner

METHOD FOR MODELING EXCESS CURRENT IN IRRADIATED BIPOLAR JUNCTION TRANSISTORS

RELATED APPLICATIONS

This application claims the benefit of provisional patent application Ser. No. 62/511,819, filed May 26, 2017, the disclosure of which is hereby incorporated herein by reference in its entirety.

GOVERNMENT SUPPORT

The invention described herein was made in the performance of work under a NASA contract NNN12AA01C, and is subject to the provisions of Public Law 96-517 (35 U.S.C. 202) in which the Contractor has elected to retain title.

FIELD OF THE DISCLOSURE

The technology of the disclosure relates generally to determining total ionizing dos (TID) response in irradiated bipolar junction transistors.

BACKGROUND

Bipolar transistors are used extensively for analog circuits utilized in space borne applications. However, the space, including the higher reaches of Earth's atmosphere, is populated by many high-energy particles that can damage the bipolar transistors. In such environments, radiation induces a large increase in bipolar base current, which can create so-called total ionizing dose (TID) effects and ultimately cause permanent damage to the bipolar transistors.

The costs associated with using linear bipolar commercial-off-the-shelf (COTS) technologies in space systems are driving the need to expand the role of modeling for parts qualification. These costs are primarily associated with the increasing sophistication of next generation space systems that require new components not yet qualified and therefore not included on preferred parts list. Due to the combination of lower cost and greater capabilities of commercial parts, the COTS technologies represent an increasing percentage of a space system's component inventory. Traditional qualification is typically expensive and inaccurate. Further, it may be prohibitive cost-wise to test every part and technology generation, particularly for lower cost space systems. As such, it may be desirable to conduct part qualification for COTS components at reduced cost and improved accuracy.

SUMMARY

Embodiments of the disclosure relate to a method for modeling excess base current in irradiated bipolar junction transistors (BJTs). The method includes quantifying and utilizing defect-related electrostatic effects (e.g., charged interface traps on surface potential and carrier concentration at bipolar base surface) of a BJT device to help improve accuracy in predicting excess base current of the BJT device in a radiation environment. In examples discussed herein, the method can be adapted to model the excess base current of a lateral P-type-N-type-P-type (LPNP) BJT device in depleted and/or accumulated surface potential states. The predicted excess base current may be used to qualify or disqualify the BJT device or an electrical circuit including the BJT device for use in a space system(s) as a commercial-off-the-shelf (COTS) component. By modeling the excess base current based on quantifying and utilizing the defect-related electrostatic effects, it may be possible to accurately predict a total-ionizing-dose (TID) response of the BJT device, thus enabling faster and lower-cost qualification of a COTS component(s) for use in the space system(s).

In one aspect, a method for modeling irradiated excess base current in a BJT device is provided. The method includes determining that a BJT device is in a defined surface potential state. The method also includes determining a base surface potential of the BJT device corresponding to the defined surface potential state. The method also includes determining a base surface charge concentration as a function of the base surface potential. The method also includes determining a maximum lateral electric field of the BJT device in the defined surface potential state based on the base surface charge concentration. The method also includes predicting an irradiated excess base current in the BJT device based on the maximum lateral electric field.

In another aspect, a non-transitory computer-readable medium (CRM) is provided. The non-transitory CRM includes software with instructions configured to determine that a BJT device is in a defined surface potential state. The software with instructions is also configured to determine a base surface potential of the BJT device corresponding to the defined surface potential state. The software with instructions is also configured to determine a base surface charge concentration as a function of the base surface potential. The software with instructions is also configured to determine a maximum lateral electric field of the BJT device in the defined surface potential state based on the base surface charge concentration. The software with instructions is also configured to predict an irradiated excess base current in the BJT device based on the maximum lateral electric field.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a method for modeling an excess base current in irradiated bipolar junction transistors (BJTs). The method includes quantifying and utilizing defect-related electrostatic effects (e.g., charged interface traps on a surface potential and carrier concentration at a bipolar base surface) of a BJT device to help improve accuracy in predicting excess base current of the BJT device in a radiation environment. In examples discussed herein, the method can be adapted to model the excess base current of a lateral P-type-N-type-P-type (LPNP) BJT device in depleted and/or accumulated surface potential states. The predicted excess base current may be used to qualify or disqualify the BJT device or an electrical circuit including the BJT device for use in a space system(s) as a commercial-off-the-shelf (COTS) component. By modeling the excess base current base on quantifying and utilizing the defect-related electrostatic effects, it may be possible to accurately predict a total-ionizing-dose (TID) response of the BJT device, thus enabling faster and lower-cost qualification of a COTS component(s) for use in the space system(s).

Before discussing the method and apparatus for modeling excess base current in an irradiated BJT device(s) with improved accuracy, a discussion of a standard model for determining excess base current is first provided with reference to FIGS. 1A-1D. The discussion of specific exemplary aspects of the method and apparatus for modeling excess base current in a BJT device with improved accuracy over the standard model starts below with reference to FIG. 2.

Figure 1A:
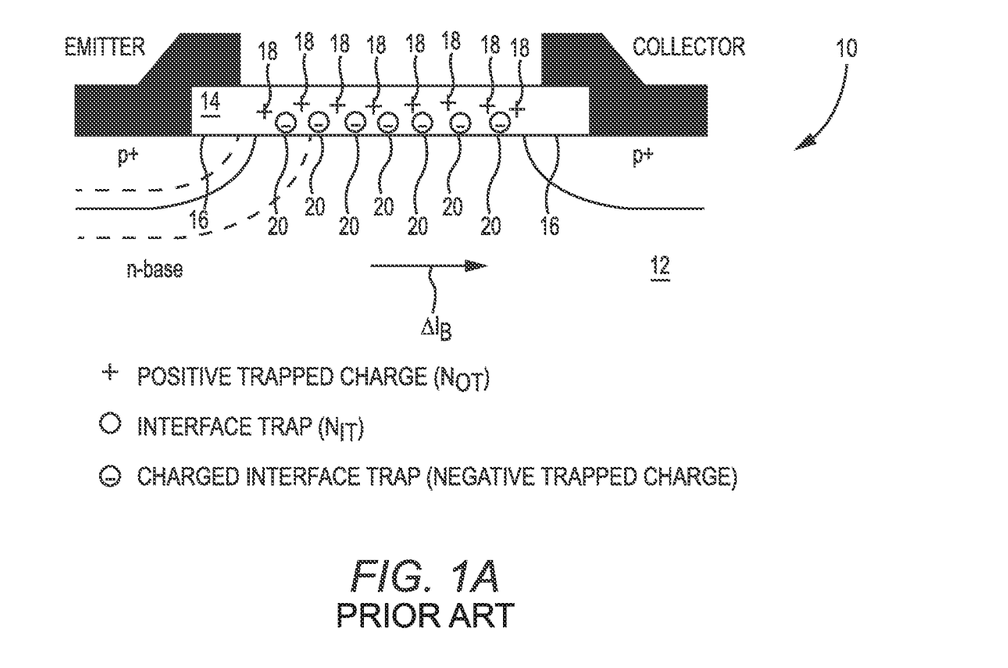
FIG. 1A is a schematic diagram of an exemplary cross-sectional view of a bipolar junction transistor (BJT) device that may be included in a space system as a commercial-off-the-shelf (COTS) component.
Figure 1B:
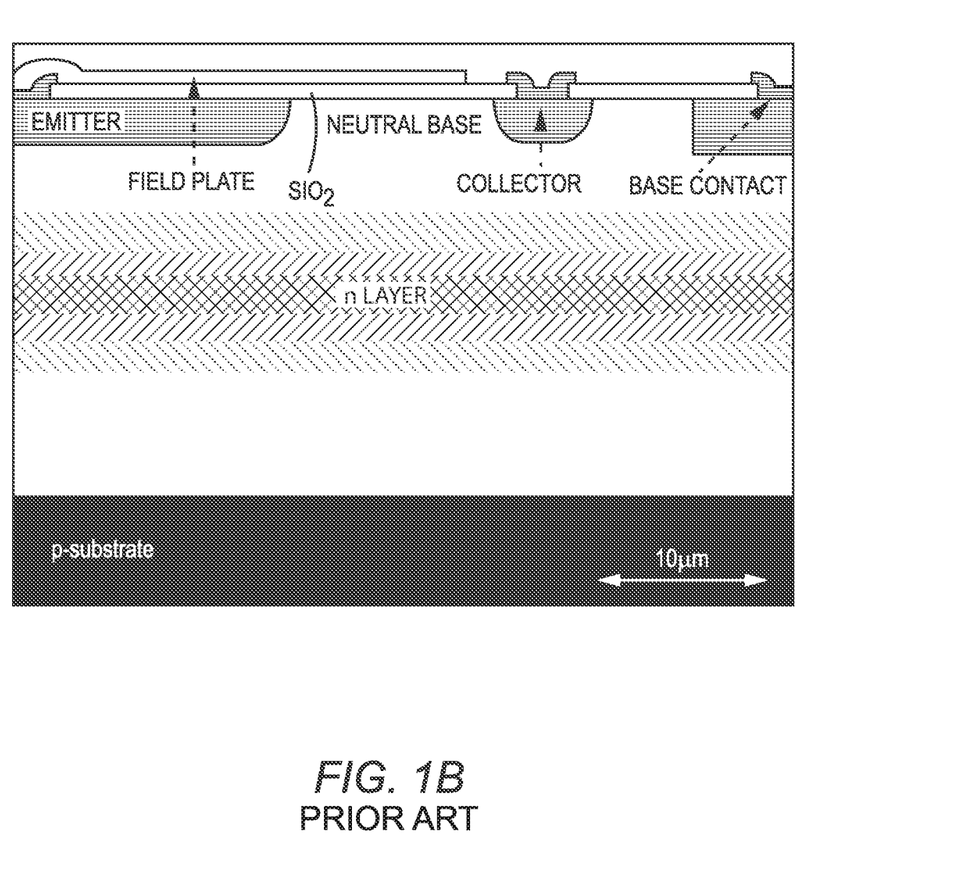
FIG. 1B is a schematic diagram of an exemplary cross-section view of a field-plated BJT device.

FIG. 1A is a schematic diagram of an exemplary cross-sectional view of a BJT device 10 that may be included in a space system as a COTS component. In a non-limiting example, the BJT device 10 can be an LPNP BJT device. The LPNP BJT device can be a non-field-plated LPNP BJT (hereinafter referred to as a "standard LPNP BJT device") or a field-plated LPNP BJT (hereinafter referred to as a "field-plated LPNP BJT device"). An exemplary illustration of the field-plated BJT device is provided in FIG. 1B. Although the exemplary aspects and equations discussed hereinafter are based on an LPNP BJT device (including the standard LPNP BJT device and the field-plated LPNP BJT device), it should be appreciated that it is also possible to model the irradiated excess base current for a lateral N-type-P-type-N-type (LNPN) BJT device by changing the polarities of certain parameters in the equations.

The BJT device 10 includes a silicon (Si) base 12 and a silicon dioxide ($SiO_2$) passivation layer 14 provided above the Si base 12. A Si—$SiO_2$ interface 16, which is interchangeably referred to as a "base surface" hereinafter, is formed between the Si base 12 and the $SiO_2$ passivation layer 14.

In an ionizing-radiation environment, the BJT device 10 experiences a buildup of oxide defects 18 in the $SiO_2$ passivation layer 14 and interface defects 20 (also referred to as "charged interface trap") at the Si—SiO$_2$ interface 16. The oxide defects 18 represent a fixed positive trapped charge (e.g., N$_{OT}$), which is also referred to as "positive trapped charge" hereinafter. The interface defects 20 act as recombination-generation (R-G) centers for interface traps (e.g., N$_{IT}$) and are typically negatively charged. The oxide defects 18 and the interface defects 20 may be caused as a result of TID irradiation. The oxide defects 18 and the interface defects 20 can cause an excess base current $\Delta I_B$ in the BJT device 10. In a non-limiting example, the excess base current $\Delta I_B$ can be utilized to determine performance of the BJT device 10 in a radiation environment (e.g., space, nuclear plant, etc.).

Figure 1C:
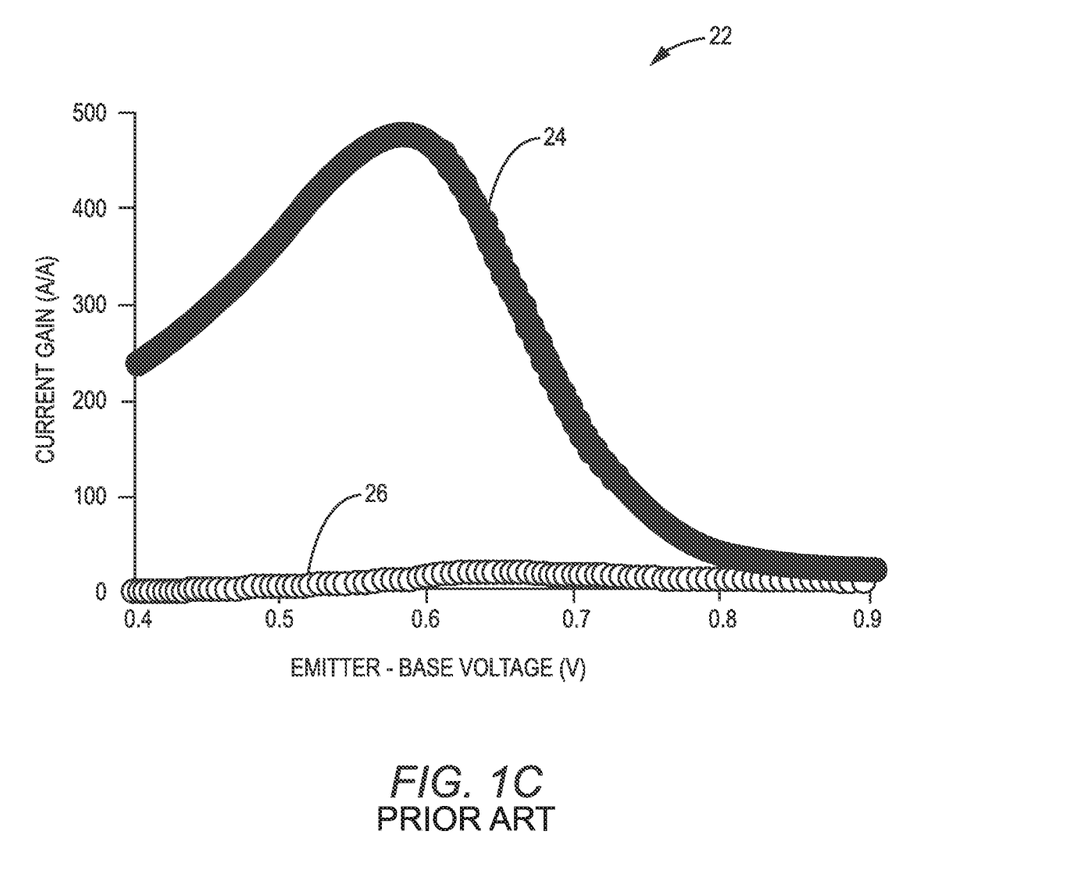
FIG. 1C is a graphic diagram providing an exemplary illustration of a relationship between a current gain and an emitter-base voltage of the BJT device of FIG. 1A prior to and after exposure to a 20 kilorads (krad) total-ionizing-dose (TID) irradiation.

FIG. 1C is a graphic diagram 22 providing an exemplary illustration of a relationship between a current gain and an emitter-base voltage of the BJT device 10 of FIG. 1A prior to and after exposure to a 20 kilorads (krad) TID irradiation. The graphic diagram 22 includes a pre-irradiation curve 24 and a post-irradiation curve 26. The pre-irradiation curve 24 illustrates the current gain of the BJT device 10 prior to exposure to the 20 krad TID irradiation. The post-irradiation curve 26 indicates that the 20 krad TID irradiation exposure results in a very large drop in the current gain over a full range of the emitter-base voltage (V$_{EB}$) compared to the pre-irradiation curve 24. Notably, the substantial drop in the current gain can be attributed to the excess base current $\Delta I_B$ in the BJT device 10.

The fundamental concept behind a standard model for modeling the excess base current $\Delta I_B$ of the BJT device 10 is that the excess base current $\Delta I_B$ is attributed to the buildup of the interface traps (N$_{IT}$), as expressed in the equation (1) below.

$$\Delta I_B \propto N_{IT}. \tag{1}$$

The excess base current $\Delta I_B$ can be further determined based on the equation (2) below.

$$\Delta I_B \cong \Upsilon \frac{qV_T n_i \pi P_E \Delta s}{2E_m} \exp\left(\frac{V_{EB}}{2V_T}\right), \tag{2}$$

In the equation (2) above, q represents magnitude of charge, V$_T$ represents thermal voltage, n$_i$ represents intrinsic carrier concentration of silicon, P$_E$ represents emitter perimeter, E$_m$ represents maximum lateral electric field in the emitter-base space charge region, and $\Delta s$ represents an increase in surface recombination velocity at the Si—SiO$_2$ interface 20 due to N$_{IT}$ buildup. The relationship between N$_{IT}$ and $\Delta s$ can be further expressed in the equation (3) below.

$$\Delta S \approx \sigma \upsilon_{th} \Delta N_{IT}. \tag{3}$$

In the equation (3) above, $\sigma$ represents carrier capture cross-section and $u_{th}$ represents carrier thermal velocity (~10$^7$ cm/s). It should also be noted that the equation (3) assumes a constant energy distribution of interface traps throughout Si bandgap, and that acceptor-like and donor-like traps are defined above and below the intrinsic Fermi level, respectively. In case the BJT device 10 has a highly asymmetrical junction, where emitter doping is much greater than base doping, the maximum lateral electric field can be expressed in the equation (4) below.

$$E_m = \left[\frac{2qN_D}{\varepsilon_{Si}}\left(V_T \ln\left[\frac{N_D}{n_i}\right] - \frac{V_{EB}}{2}\right)\right]^{\frac{1}{2}}, \tag{4}$$

In the equation (4) above, $\varepsilon S_i$ represents permittivity of silicon. E$_m$ is also a function of V$_{EB}$ and N$_D$, which represents dopant concentration of the Si base 12 (also referred to as "base doping term"). As is shown in the equation (2), E$_m$ is an important factor in calculating the excess base current $\Delta I_B$. For an ideal (pre-irradiated) BJT, base current can typically be approximated based on the equation (5) below.

$$I_B(\text{ideal}) = qA_E \frac{D_n n_i^2}{N_E W_E} \exp\left(\frac{V_{EB}}{V_T}\right), \tag{5}$$

In the equation (5) above, A$_E$ represents active emitter area, D$_n$ represents diffusion constant, N$_E$ represents emitter doping, and W$_E$ represents effective emitter width. The total base current can be determined based on the equation (6) below.

$$I_B = I_B(\text{ideal}) + \Delta I_B. \tag{6}$$

Figure 1D:
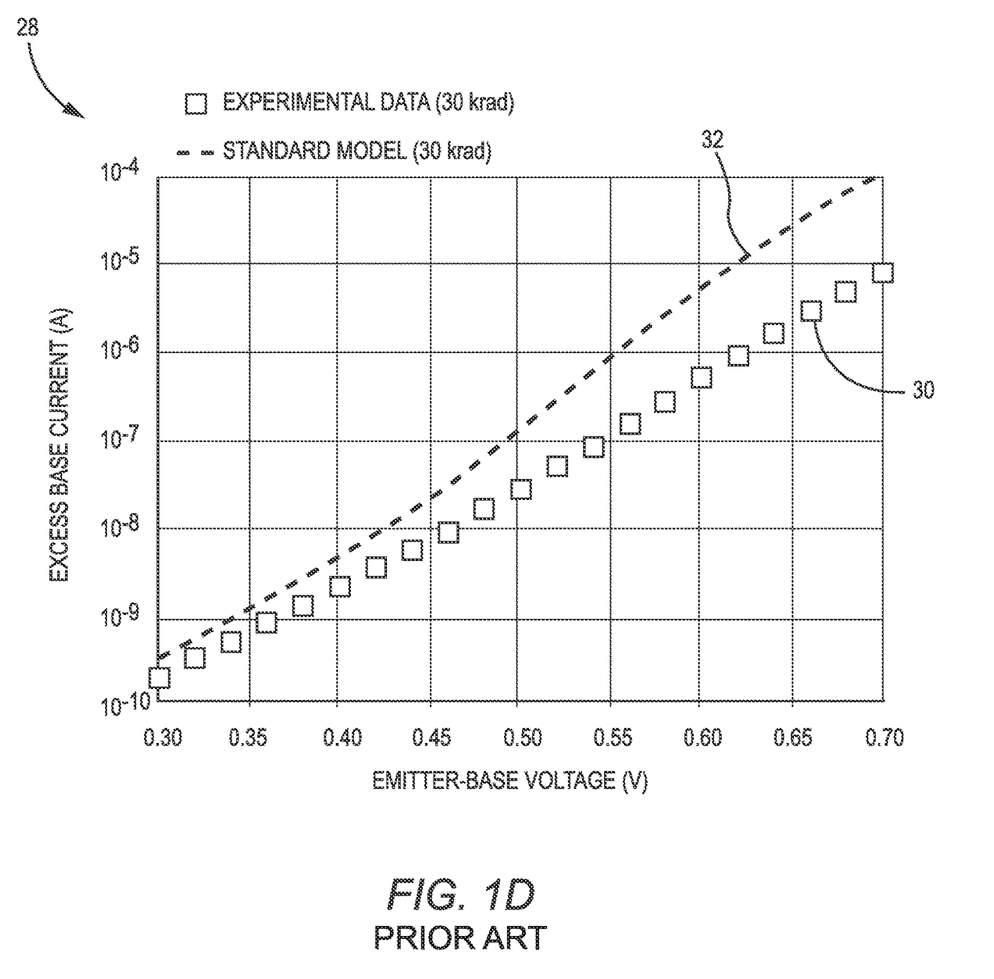
FIG. 1D is a graphic diagram providing an exemplary illustration of a relationship between excess base current and the emitter-base voltage of the BJT device of FIG. 1A when the BJT device is exposed to 30 krad TID irradiation.

FIG. 1D is a graphic diagram 28 providing an exemplary illustration of a relationship between the excess base current ($\Delta I_B$) and the emitter-base voltage (V$_{EB}$) of the BJT device 10 of FIG. 1A when the BJT device 10 is exposed to 30 krad TID irradiation. The graphic diagram 28 includes an experimentally obtained excess base current curve 30. The graphic diagram 28 also includes a predicted excess base current curve 32 as calculated by the standard model using the equations (2)-(4) above and the parameters as provided in Table I below.

TABLE I

Constants and Device Parameters

| Symbol | Parameter | Value | Units |
|---|---|---|---|
| V$_T$ | thermal voltage | 0.0258 | V |
| $\phi_B$ | base bulk potential | 0.298 | V |
| Eg | Si bandgap energy | 1.12 | eV |
| $\sigma$ | capture cross-section | 7.5 × 10$^{-15}$ | cm |
| $\upsilon_{TH}$ | thermal velocity | 10$^7$ | cm/s |
| q | elementary charge | 1.602 × 10$^{-19}$ | C |
| $\varepsilon_{Si}$ | permittivity of Si | 1.04 × 10$^{-12}$ | F/cm |
| C$_{ox}$ | Oxide capacitance | 2.88 × 10$^{-9}$ | F/cm$^2$ |
| n$_i$ | intrinsic carrier conc. | 9.89 × 10$^9$ | cm$^{-3}$ |
| N$_A$ | emitter doping conc. | 2.00 × 10$^{18}$ | cm$^{-3}$ |
| N$_D$ | base doping conc. | 1.00 × 10$^{15}$ | cm$^{-3}$ |
| D$_n$ | electron diff. coeff. | 25.8 | cm$^2$/s |
| P$_E$ | emitter perimeter | 1.036 × 10$^{-2}$ | cm |
| W$_B$ | base width | 1.20 × 10$^{-3}$ | cm |

The standard model calculations use concentrations of N$_{IT}$ and N$_{OT}$ extracted from experimental data using established mathematical methods. At 30 krad TID irradiation, the concentrations of N$_{IT}$ and N$_{OT}$ are calculated to be 1.19×10$^{11}$ cm$^{-2}$ and 7.36×10$^{10}$ cm$^{-2}$, respectively. It should be noted, however, that the standard model does not have a way to capture the electrostatic effects of either N$_{OT}$ or charged interface traps (N$_{IT}$) at the Si—SiO$_2$ interface 20.

The discrepancy between the predicted excess base current curve 32 and the excess base current curve 30 indicates that the standard model does not accurately predict the more realistic excess base current response obtained from experimental data. Indeed, for an emitter-base voltage of 0.5V, the predicted excess base current as shown on curve 32 is nearly five times higher than the excess base current shown on the experimentally obtained excess base current curve 30. The failure of the standard model to incorporate the electrostatic effects of the defects significantly limits the accuracy of the standard model.

With reference back to FIG. 1A, in the equation (2) above, the only mechanism responsible for affecting the excess base current $\Delta I_B$ is the $\Delta s$, which represents the increase in surface recombination velocity at the Si—SiO$_2$ interface 20 due to buildup of the interface traps (N$_{IT}$). However, it can be shown that the interface defects 20 at the Si—SiO$_2$ interface 16, which represent the negative charge state of the interface traps (N$_{IT}$) also plays an important role in determining the radiation-induced excess base current $\Delta I_B$ in the BJT device 10. As such, it may be desirable to improve accuracy of the standard model to provide a more accurate prediction of the excess base current $\Delta I_B$ by further taking into consideration the effects associated with the interface defects 20 at the Si—SiO$_2$ interface 16.

Figure 2:
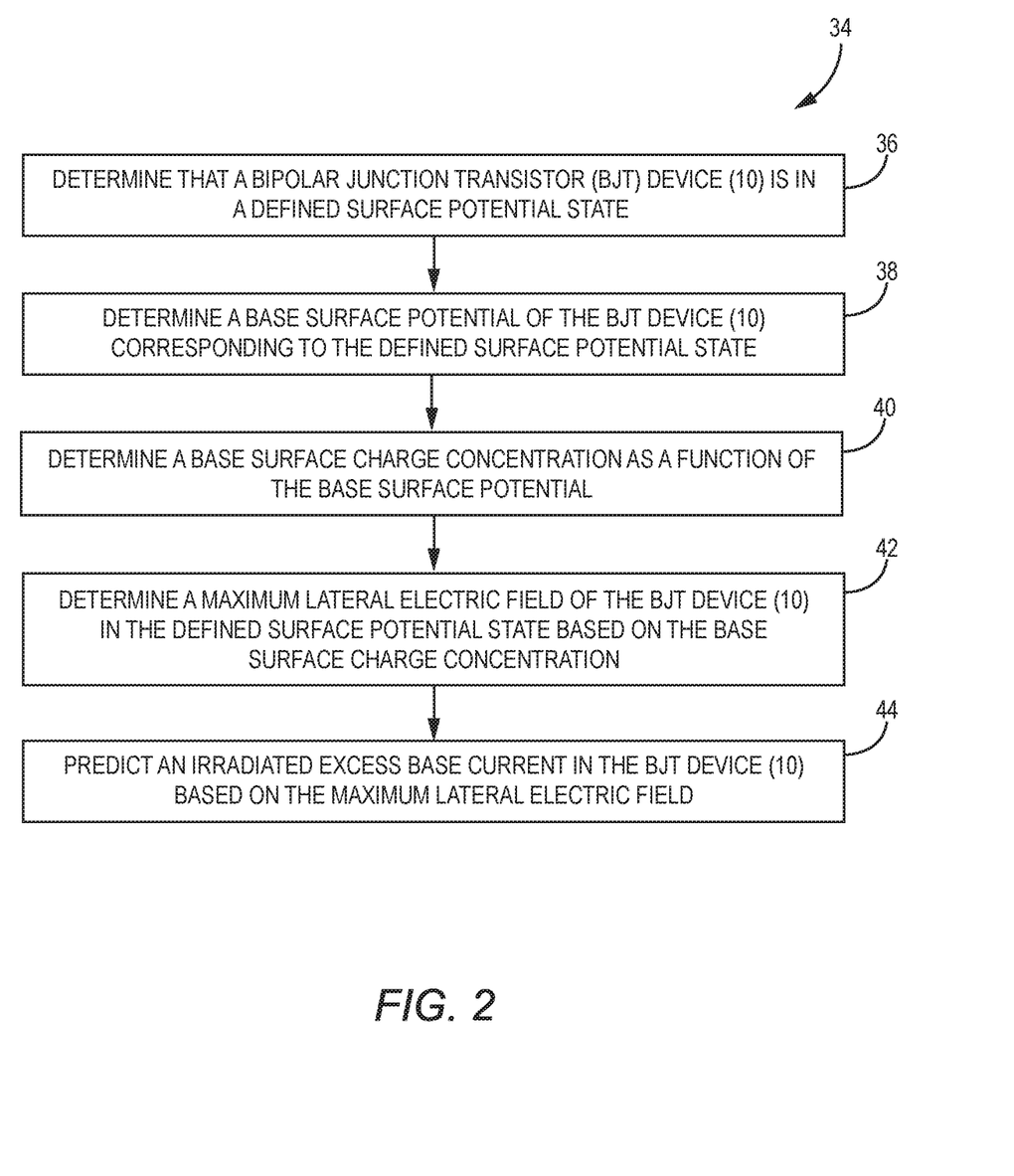
FIG. 2 is a flowchart of an exemplary process for modeling an irradiated excess base current in the BJT device of FIG. 1A according to an embodiment of the present disclosure.

In this regard, FIG. 2 is a flowchart of an exemplary process 34 for modeling the excess base current $\Delta I_B$ in the BJT device 10 of FIG. 1 according to an embodiment of the present disclosure. As discussed in detail below, the process 34 quantifies defect-related electrostatic effects, such as the charged interface traps on surface potential and carrier concentration at a bipolar base surface, to help improve accuracy in predicting excess base current of the BJT device 10 in a radiation environment. The predicted excess base current may be used to qualify or disqualify an electrical circuit(s) containing a COTS BJT device(s) for use in a space system(s). By modeling the excess base current base on quantifying the defect-related electrostatic effects, it may be possible to accurately predict a TID response of the electrical circuit(s), thus enabling faster and lower-cost qualification of the COTS BJT device(s) for use in the space system(s).

The BJT device 10 may operate in a depleted state (also referred to as "surface depletion" or "depleted surface potential state") or an accumulated state (also referred to as "surface accumulation" or "accumulated surface potential state"). When the BJT device 10 is in the depleted state, the level of the interface defects 20 exceeds the level of the oxide defects 18 (e.g., N$_{IT}$/2>N$_{OT}$). In contrast, when the BJT device 10 is in the accumulated state, the level of the oxide defects 18 exceeds the level of the interface defects 20 (e.g., N$_{IT}$/2<N$_{OT}$). Notably, the depleted state and the accumulated state of the Si—SiO$_2$ interface 16 can lead to a difference in surface carrier concentration between surface depletion and surface accumulation. In this regard, a model based on the process 34 (hereinafter referred to as "advanced model") first determines that the BJT device 10 is operating in a defined surface potential state (e.g., the depleted state or the accumulated state) (block 36). Next, the advanced model determines a base surface potential of the BJT device 10 corresponding to the defined surface potential state (block 38).

If the surface depletion condition exists in the BJT device 10, it is an indication that the BJT device 10 is in the depleted state. In contrast, if the surface accumulation condition exists in the BJT device 10, it is an indication that the BJT device 10 is in the accumulated state. If the BJT device 10 is the standard BJT device and is determined as being in the depleted state, using a sheet charge approximation and solving for the electric field at the boundary of the Si—SiO$_2$ surface 16, the advanced model can calculate the base surface potential explicitly using the analytical equation (7) below.

$$\psi_x = \frac{-q\left(\frac{N_{it}}{2} - N_{ot}\right)^2}{2\varepsilon_{Si}N_D}. \tag{7}$$

In case the BJT device 10 is the standard BJT device, the advanced model may also calculate the base surface potential of the BJT device 10 implicitly based on the equations (8)-(12) regardless of whether the BJT device 10 is in the depleted state or the accumulated state.

$$n_s(\psi_s) = N_D \exp\left(\frac{\psi_s}{V_T}\right) \tag{8}$$

$$(\phi_{nt} - \psi_s)^2 = \text{sgn}(\psi_s)\gamma_B^2 V_T H(\psi_s) \tag{9}$$

$$\phi_{nt} = \frac{q}{C_{ox}}\left[N_{OT} - N_{IT}\frac{(\psi_s + \phi_B)}{E_g}\right] \tag{10}$$

$$H(\psi_s) = \begin{bmatrix} \frac{n_i^2}{N_D^2}\left(\exp\left(-\frac{\psi_s}{V_T}\right) + \frac{\psi_s}{V_T} - 1\right) + \\ \left(\exp\left(\frac{\psi_s}{V_T}\right) - \frac{\psi_s}{V_T} - 1\right) \end{bmatrix} \tag{11}$$

$$\gamma_B = \frac{\sqrt{2\varepsilon_{Si}qN_D}}{C_{ox}} \tag{12}$$

In case the BJT device 10 is the field-plated BJT device, the advanced model may also calculate the base surface potential of the BJT device 10 implicitly based on the equations (8), (13), and (10)-(12) regardless of whether the BJT device 10 is in the depleted state or the accumulated state.

$$(V_{EB} - V_{bi} + \phi_{nt} - \psi_s)^2 = \text{sgn}(\psi_s)\gamma_B^2 V_T H(\psi_s) \tag{13}$$

Upon determining the base surface potential of the BJT device 10, the advanced model further determines a base surface charge concentration as a function of the base surface potential (block 40). In this regard, the advanced model can determine the base surface charge concentration based on the equation (14) below.

$$n(x) = n_s = N_D \exp\left(\frac{\psi_s}{V_T}\right) \tag{14}$$

Upon determining the base surface charge concentration, the advanced model further determines a maximum lateral electric field of the BJT device 10 in the defined surface potential state (e.g., depleted state) based on the base surface charge concentration (block 42). In the case of surface depletion, the surface majority carrier concentration of the BJT device 10 is decreased, and the maximum electric field expression in the equation (4) is modified by the equation (15) below.

$$E_m(n_s) = \left[\frac{2qn_s(\psi_s)}{\varepsilon_{Si}}\left(V_T \ln\left[\frac{n_s(\psi_s)}{n_i}\right] - \frac{V_{EB}}{2}\right)\right]^{\frac{1}{2}} \tag{15}$$

In the equation (14) above, the surface carrier concentration term $n_s(\psi_s)$ replaces the base doping term $N_D$ in the equation (4). The excess base current term in the equation (2) is then modified as shown below in the equation (16).

Accordingly, the advanced model can predict the irradiated excess base current $\Delta I_B$ based on the maximum lateral electric field (block 44).

$$\Delta I_B \cong \frac{qV_T n_i \pi P_E \Delta s}{2E_m(n_s)} \exp\left(\frac{V_{EB}}{2V_T}\right). \tag{16}$$

Figure 3:
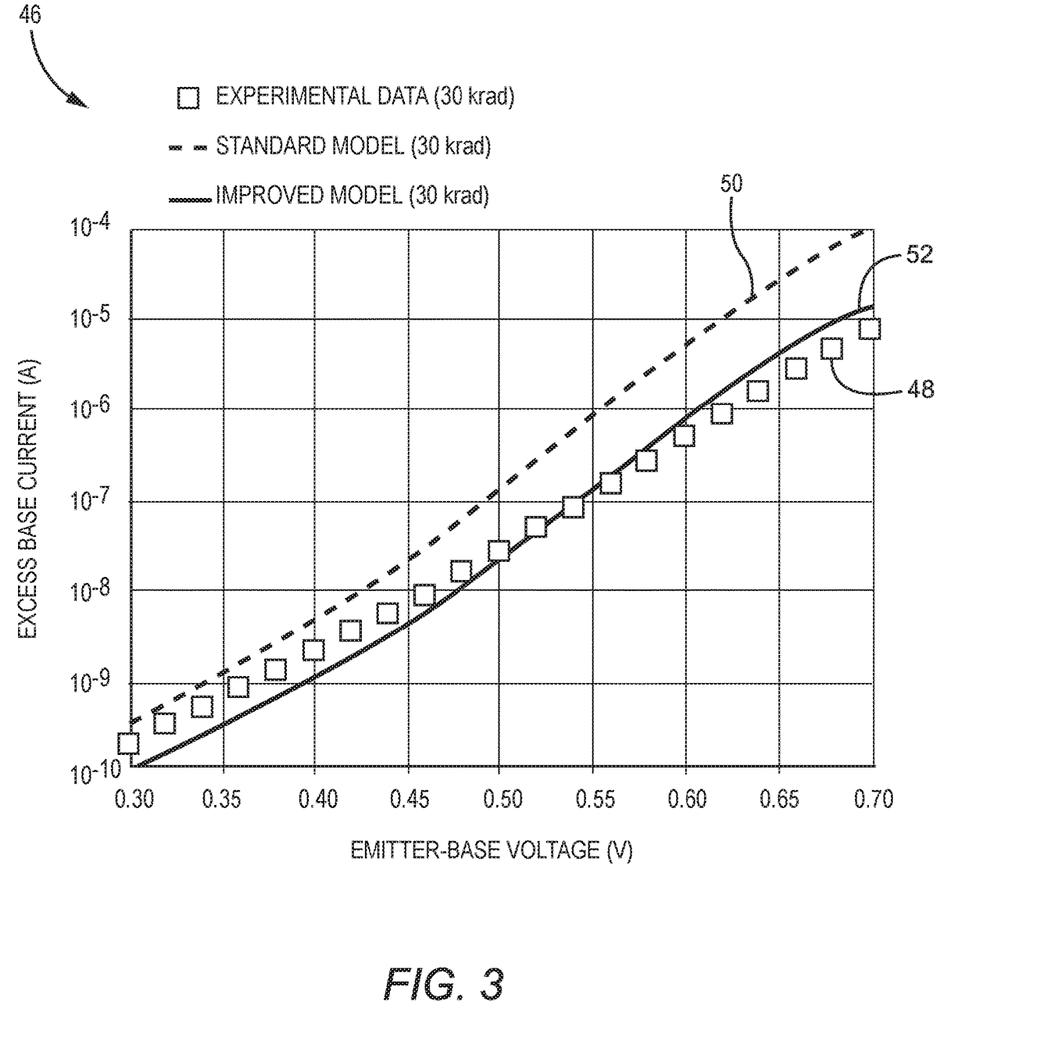
FIG. 3 is a graphic diagram providing an exemplary illustration of an improved irradiated excess base current prediction made by an advanced model operating based on the process of FIG. 2.

FIG. 3 is a graphic diagram 46 providing an exemplary illustration of an improved irradiated excess base current prediction made by the advanced model operating based on the process of FIG. 2. The graphic diagram 46 includes a same experimentally obtained excess base current curve 48 for a TID irradiation of 30 krad as shown in FIG. 1D. The graphic diagram 46 also includes a same predicted excess base current curve 50 as calculated by the standard model shown in FIG. 1D. The graphic diagram 46 also includes an improved predicted excess base current curve 52 as calculated by the advanced model using the equations (13)-(16) above and the parameters as provided in Table I.

As in the previous case, this model uses the same values of $N_{IT}$ and $N_{OT}$ extracted from experimental data using established mathematical methods. Recall that in FIG. 1D, at 30 krad TID irradiation, the concentrations of $N_{IT}$ and $N_{OT}$ are calculated to be $1.19 \times 10^{11}$ cm$^{-2}$ and $7.36 \times 10^{10}$ cm$^{-2}$, respectively. Unlike the standard model, the advanced model captures the electrostatic effects of $N_{OT}$ and the charged interface traps ($N_{IT}$), resulting in a significantly closer match to the experimentally obtained excess base current curve 48

Figure 4:
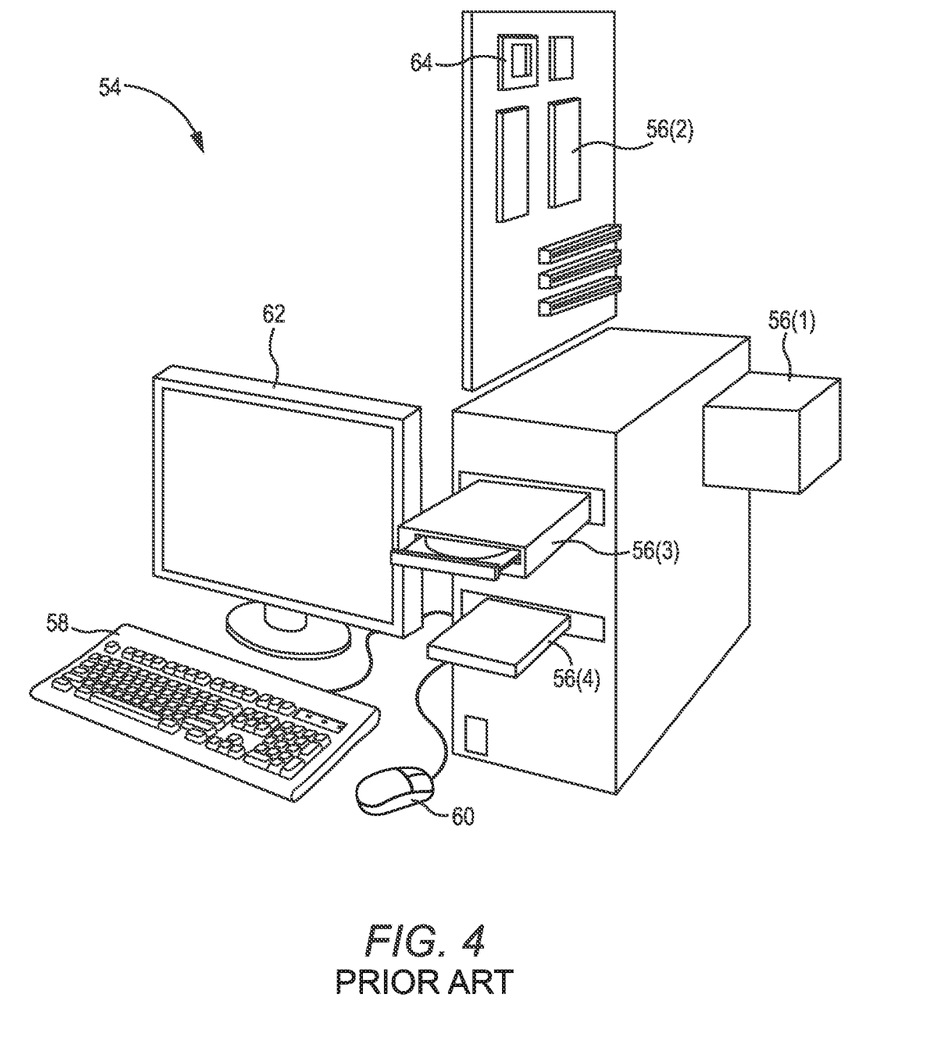
FIG. 4 is a schematic diagram of an exemplary computer system including one or more non-transitory computer-readable media for storing software instructions to implement the process of FIG. 2.

FIG. 4 is a schematic diagram of an exemplary computer system 54 including one or more non-transitory computer-readable media 56(1)-56(4) for storing software instructions to implement the process 34 of FIG. 2. The non-transitory computer-readable media 56(1)-56(4) further include a hard drive 56(1), an on-board memory system 56(2), a compact disc 56(3), and a floppy disk 56(4). Each of the non-transitory computer-readable media 56(1)-56(4) may be configured to store the software instructions to implement the process 34.

The computer system 54 also includes a keyboard 58 and a computer mouse 60 for inputting the software instructions onto the non-transitory computer-readable media 56(1)-56(4). The keyboard 58 and the computer mouse 60 may also be used to input the initial system parameter of the process 34, which can be used to implement the advanced model according to the process 34.

The computer system 54 also includes a monitor 62 for providing an indication of the irradiated excess base current predicted by the advanced model. The monitor 62 may also indicate whether the BJT device 10 of FIG. 1A and/or an electrical circuit containing the BJT device 10 is qualified or disqualified for being used as a COTS component in a space system.

Further, the computer system 54 includes a processor 64 configured to read the software instructions from the non-transitory computer-readable media 56(1)-56(4) and execute the software instructions to implement the process 34. While the computer system 54 is illustrated as a single device, the computer system 54 may also be a computer network deployed according to a centralized topology or a distributed topology.

Those skilled in the art will recognize improvements and modifications to the preferred embodiments of the present disclosure. All such improvements and modifications are considered within the scope of the concepts disclosed herein and the claims that follow.

What is claimed is:

1. A method for modeling an irradiated excess base current in a bipolar junction transistor (BJT) device, comprising:
   measuring a level of interface defects and a level of oxide defects of the BJT device;
   determining that the BJT device is in a defined surface potential state based on the measured level of interface defects and the measured level of oxide defects, wherein:
     the defined surface potential state is a depleted state when the level of interface defects exceeds the level of oxide defects; and
     the defined surface potential state is an accumulated state when the level of oxide defects exceeds the level of interface defects;
   determining a base surface potential of the BJT device corresponding to the defined surface potential state;
   determining a base surface charge concentration as a function of the base surface potential;
   determining a maximum lateral electric field of the BJT device in the defined surface potential state based on the base surface charge concentration;
   predicting the irradiated excess base current in the BJT device based on the maximum lateral electric field; and
   qualifying or disqualifying the BJT device for use in an ionizing-radiation environment as a commercial-off-the-shelf (COTS) component based on the irradiated excess base current.

2. The method of claim 1 wherein qualifying or disqualifying the BJT device for use in the ionizing-radiation environment comprises qualifying or disqualifying the BJT device for use in a space system as the COTS component based on the irradiated excess base current.

3. The method of claim 1 wherein qualifying or disqualifying the BJT device for use in the ionizing-radiation environment comprises qualifying or disqualifying an electrical circuit comprising the BJT device for use in a space system as the (COTS) component based on the irradiated excess base current.

4. The method of claim 1 further comprising:
   determining that the BJT device is in a depleted surface potential state;
   determining the base surface potential of the BJT device by using a sheet charge and depleted approximation and solving for an electric field at a silicon-silicon dioxide (Si—SiO$_2$) interface of the BJT device;
   determining the base surface charge concentration as the function of the base surface potential;
   determining the maximum lateral electric field of the BJT device in the depleted surface potential state based on the base surface charge concentration; and
   predicting the irradiated excess base current in the BJT device based on the maximum lateral electric field.

5. The method of claim 4 further comprising:
   determining that a non-field plated lateral P-type-N-type-P-type (LPNP) BJT device is in the depleted surface potential state;
   determining the base surface potential of the non-field plated LPNP BJT device corresponding to the depleted surface potential state;
   determining the base surface charge concentration as the function of the base surface potential;
   determining the maximum lateral electric field of the non-field plated LPNP BJT device in the depleted surface potential state based on the base surface charge concentration; and predicting the irradiated excess base current in the non-field plated LPNP BJT device based on the maximum lateral electric field.

6. The method of claim 5 further comprising determining the base surface potential of the non-field plated LPNP BJT device corresponding to the depleted surface potential state explicitly.

7. The method of claim 5 further comprising determining the base surface potential of the non-field plated LPNP BJT device corresponding to the depleted surface potential state implicitly.

8. The method of claim 4 further comprising:
determining that a field plated lateral P-type-N-type-P-type (LPNP) BJT device is in the depleted surface potential state;
determining the base surface potential of the field plated LPNP BJT device corresponding to the depleted surface potential state;
determining the base surface charge concentration as the function of the base surface potential;
determining the maximum lateral electric field of the field plated LPNP BJT device in the depleted surface potential state based on the base surface charge concentration; and
predicting the irradiated excess base current in the field plated LPNP BJT device based on the maximum lateral electric field.

9. The method of claim 8 further comprising determining the base surface potential of the field plated LPNP BJT device corresponding to the depleted surface potential state implicitly.

10. The method of claim 1 further comprising:
determining that the BJT device is in an accumulated surface potential state;
determining the base surface potential of the BJT device by using a sheet charge and Debye length approximation and solving for an electric field at a silicon-silicon dioxide ($Si$—$SiO_2$) interface of the BJT device;
determining the base surface charge concentration as the function of the base surface potential;
determining the maximum lateral electric field of the BJT device in the accumulated surface potential state based on the base surface charge concentration; and
predicting the irradiated excess base current in the BJT device based on the maximum lateral electric field.

11. The method of claim 10 further comprising:
determining that a non-field plated lateral P-type-N-type-P-type (LPNP) BJT device is in the accumulated surface potential state;
determining the base surface potential of the non-field plated LPNP BJT device corresponding to the accumulated surface potential state;
determining the base surface charge concentration as the function of the base surface potential;
determining the maximum lateral electric field of the non-field plated LPNP BJT device in the accumulated surface potential state based on the base surface charge concentration; and
predicting the irradiated excess base current in the non-field plated LPNP BJT device based on the maximum lateral electric field.

12. The method of claim 11 further comprising determining the base surface potential of the non-field plated LPNP BJT device corresponding to the accumulated surface potential state implicitly.

13. The method of claim 10 further comprising:
determining that a field plated lateral P-type-N-type-P-type (LPNP) BJT device is in the accumulated surface potential state;
determining the base surface potential of the field plated LPNP BJT device corresponding to the accumulated surface potential state;
determining the base surface charge concentration as the function of the base surface potential;
determining the maximum lateral electric field of the field plated LPNP BJT device in the accumulated surface potential state based on the base surface charge concentration; and
predicting the irradiated excess base current in the field plated LPNP BJT device based on the maximum lateral electric field.

14. The method of claim 13 further comprising determining the base surface potential of the field plated LPNP BJT device corresponding to the accumulated surface potential state implicitly.

15. A non-transitory computer-readable medium (CRM) storing software with instructions configured to:
measure a level of interface defects and a level of oxide defects of a bipolar junction transistor (BJT) device;
determine that the BJT device is in a defined surface potential state based on the measured level of interface defects and the measured level of oxide defects, wherein:
the defined surface potential state is a depleted state when the level of interface defects exceeds the level of oxide defects; and
the defined surface potential state is an accumulated state when the level of oxide defects exceeds the level of interface defects;
determine a base surface potential of the BJT device corresponding to the defined surface potential state;
determine a base surface charge concentration as a function of the base surface potential;
determine a maximum lateral electric field of the BJT device in the defined surface potential state based on the base surface charge concentration;
predict an irradiated excess base current in the BJT device based on the maximum lateral electric field; and
qualify or disqualify the BJT device for use in an ionizing-radiation environment as a commercial-off-the-shelf (COTS) component based on the irradiated excess base current.

16. The non-transitory CRM of claim 15 wherein the software with instructions is further configured to qualify or disqualify the BJT device for use in a space system as the (COTS) component based on the irradiated excess base current.

17. The non-transitory CRM of claim 15 wherein the software with instructions is further configured to:
determine that the BJT device is in a depleted surface potential state;
determine the base surface potential of the BJT device by using a sheet charge and depleted approximation and solving for an electric field at a silicon-silicon dioxide ($Si$—$SiO_2$) interface of the BJT device;
determine the base surface charge concentration as the function of the base surface potential;
determine the maximum lateral electric field of the BJT device in the depleted surface potential state based on the base surface charge concentration; and
predict the irradiated excess base current in the BJT device based on the maximum lateral electric field.

18. The non-transitory CRM of claim 17 wherein the software with instructions is further configured to determine the base surface potential of a non-field plated lateral P-type-N-type-P-type (LPNP) BJT device corresponding to the depleted surface potential state explicitly or implicitly.

19. The non-transitory CRM of claim 15 wherein the software with instructions is further configured to:
- determine that the BJT device is in an accumulated surface potential state; determine the base surface potential of the BJT device by using a sheet charge and Debye length approximation and solving for an electric field at a silicon-silicon dioxide (Si—$SiO_2$) interface of the BJT device;
- determine the base surface charge concentration as the function of the base surface potential;
- determine the maximum lateral electric field of the BJT device in the accumulated surface potential state based on the base surface charge concentration; and
- predict the irradiated excess base current in the BJT device based on the maximum lateral electric field.

20. The non-transitory CRM of claim 19 wherein the software with instructions is further configured to determine the base surface potential of the non-field plated LPNP BJT device corresponding to the accumulated surface potential state implicitly.

* * * * *